United States Patent [19]

Puri et al.

[11] 4,421,994

[45] Dec. 20, 1983

[54] HIGH SPEED LINE DRIVER WITH GROUND OUTPUT CAPABILITY

[75] Inventors: Yogi K. Puri, Vienna; Keith M. A. Selbo, Manassas, both of Va.

[73] Assignee: IBM Corporation, Armonk, N.Y.

[21] Appl. No.: 317,659

[22] Filed: Nov. 2, 1981

[51] Int. Cl.³ .......................... H03K 3/01; H03K 3/26
[52] U.S. Cl. ............................... 307/200 B; 307/270; 307/577
[58] Field of Search .................... 307/200 B, 443, 270, 307/577, 442, 572, 575, 135; 361/58

[56] References Cited

U.S. PATENT DOCUMENTS

| | | | |
|---|---|---|---|
| 3,749,936 | 7/1973 | Bell | 307/442 |
| 4,061,928 | 12/1977 | Kessler | 307/200 B |
| 4,329,600 | 5/1982 | Stewart | 307/270 |
| 4,347,447 | 9/1982 | Proebstring | 307/442 |
| 4,363,068 | 12/1982 | Burns | 307/200 B |

*Primary Examiner*—John S. Heyman
*Assistant Examiner*—Timothy P. Callahan
*Attorney, Agent, or Firm*—Maurice H. Klitzman

[57] ABSTRACT

An FET driver circuit is disclosed which provides short circuit protection at the output node without reducing its performance. Grounded short circuit protection is achieved by sharing a load resistance at the output node in two parallel components, a low resistance active FET load and a high resistance active FET load. A delay element is inserted between the data input node and the gate for the low resistance active FET load. When the data input is low, both of the active FET load devices are off and the active logical FET device is on causing a low output value for the circuit. When the data input for the circuit goes high, the output capacitance is initially charged by the high resistance FET load device and is followed after a short delay, by charging through the low resistance FET load device. The low resistance FET load device cuts off current flow automatically after a predetermined period of time transpires. This delay duration is designed to be equal to or greater than the desired output rise time for the circuit, and less than the time required to destroy the low resistance device if it were to have its output terminal grounded. Thus, if the output of the circuit is accidentally shorted to ground, the circuit is protected because the brief on-time of the low resistance device limits power dissipation below destructive levels, and because the short circuit current in the high resistance device is of insufficient magnitude to cause problems.

10 Claims, 5 Drawing Figures

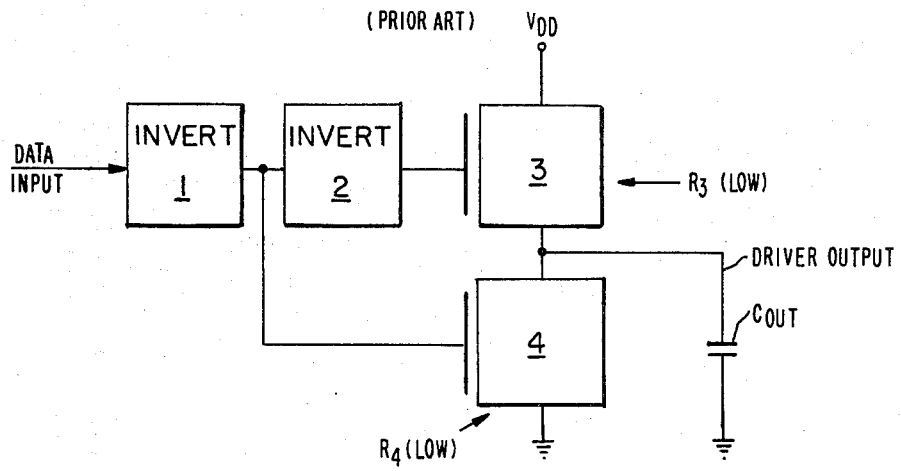
FIG. 1 (PRIOR ART)
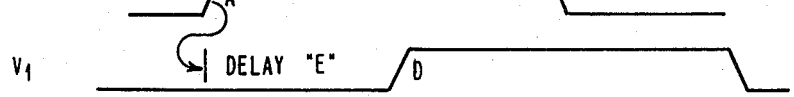
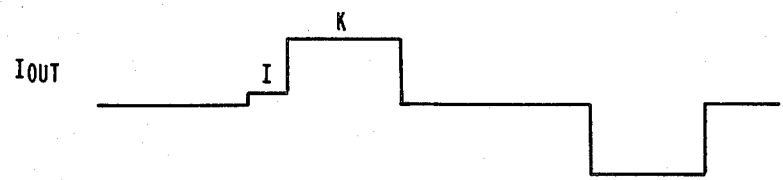
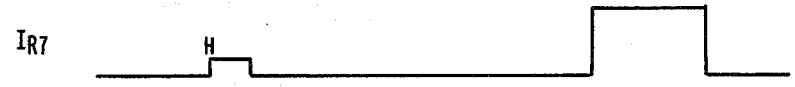
FIG. 3 NORMAL

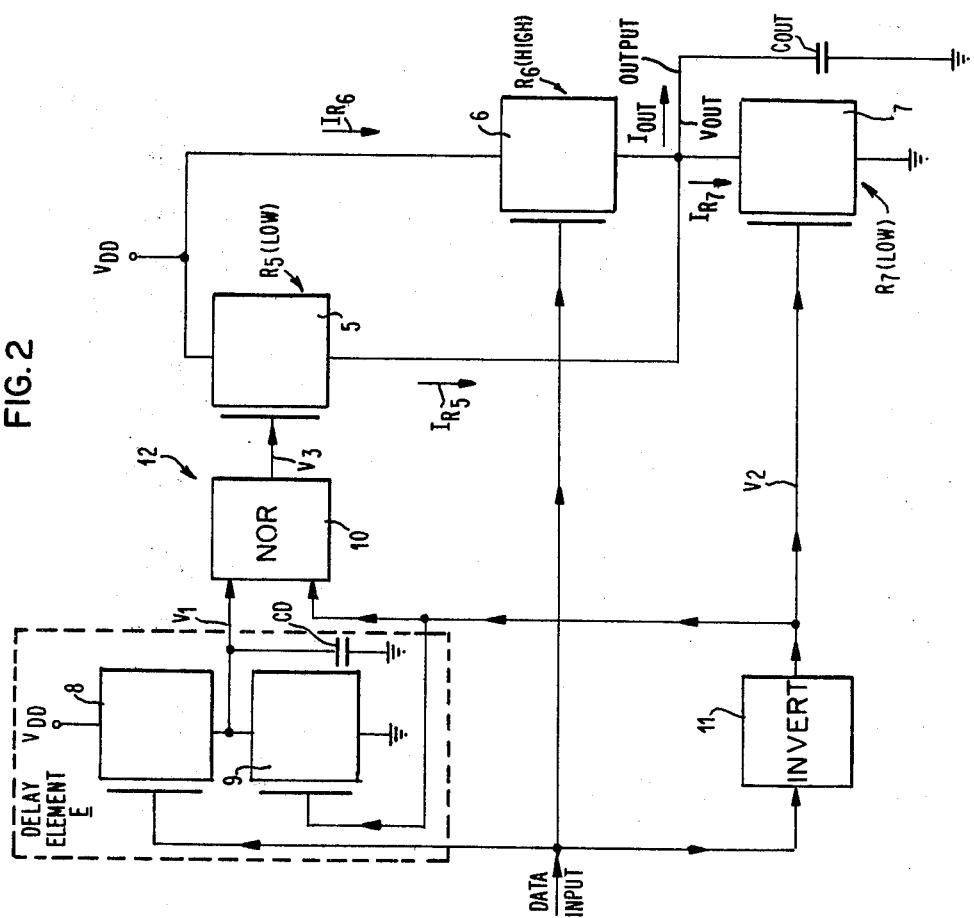

HIGH SPEED LINE DRIVER WITH GROUND OUTPUT CAPABILITY

FIELD OF THE INVENTION

The invention disclosed broadly relates to semiconductor circuits and more particularly relates to improvements in FET driver circuits.

BACKGROUND OF THE INVENTION

FIG. 1 illustrates a conventional line driver circuit which transfers a data signal from its input at the inverter 1 to the driver output without changing its polarity. The output of the inverter 1 is applied to the gate of the active FET device 4 and also to the input of the inverter 2. The output of the inverter 2 is applied to the gate of the FET load device 3. The FET active device 4 has a relatively low on-resistance R4 and the FET load device 3 has a relatively low on-resistance R3. When the conventional driver circuit of FIG. 1 is in its binary 1 state with the relatively high level binary signal at the data input and at the data output, the circuit can be inadvertently destroyed by the accidental grounding of the output terminal. This would cause excessive current to be conducted from the drain potential VDD through the relatively low resistance R3 of the load device 3 to the output node. The magnitude of the shorting current could be reduced by increasing the resistance R3 of the load device 3, however this will severely impair the rise time characteristics of the output signal during ordinary operation since the signal current passing through the load device 3 must charge the output capacitance $C_{out}$ in transitioning from the low level to the high level.

OBJECTS OF THE INVENTION

It is therefore an object of the invention to provide an improved FET driver circuit.

It is still a further object of the invention to provide an FET driver circuit which is relatively immune to short circuiting its output node to ground.

It is still a further object of the invention to provide an FET driver circuit which is relatively immune to short circuiting its output node to ground while also providing high speed circuit switching characteristics.

It is still another object of the invention to provide an FET driver circuit which is relatively immune to short circuiting to either ground potential or drain potential.

SUMMARY OF THE INVENTION

These and other objects, features and advantages of the invention are accomplished by the high speed FET driver circuit disclosed herein. An FET driver circuit is disclosed which provides short circuit protection at the output node without reducing its performance. Grounded short circuit protection is achieved by sharing a load resistance at the output node in two parallel components, a low resistance active FET load and a high resistance active FET load. A delay element is inserted between the data input node and the gate for the low resistance active FET load. When the data input is low, both of the active FET load devices are off and the active logical FET device is on causing a low output value for the circuit. When the data input for the circuit goes high, the output capacitance is initially charged by the high resistance FET load device and is followed after a short delay, by charging through the low resistance FET load device. The low resistance FET load device cuts off current flow automatically after a predetermined period of time transpires. This delay duration is designed to be equal to or greater than the desired output rise time for the circuit, and less than the time required to destroy the low resistance device if it were to have its output terminal grounded. Thus, if the output of the circuit is accidentally shorted to ground, the circuit is protected because the brief on-time of the low resistance device limits power dissipation below destructive levels, and because the short circuit current in the high resistance device is of insufficient magnitude to cause problems.

DESCRIPTION OF THE FIGURES

These and other objects, features and advantages of the invention will be more fully appreciated with reference to the accompanying figures.

FIG. 1 illustrates a conventional line driver circuit.

FIG. 2 illustrates the high speed FET line driver circuit invention.

FIG. 3 is a waveform diagram of the line driver under normal conditions.

FIG. 4 is a waveform diagram of the line driver with a grounded output.

DISCUSSION OF THE PREFERRED EMBODIMENT

Figure 5:
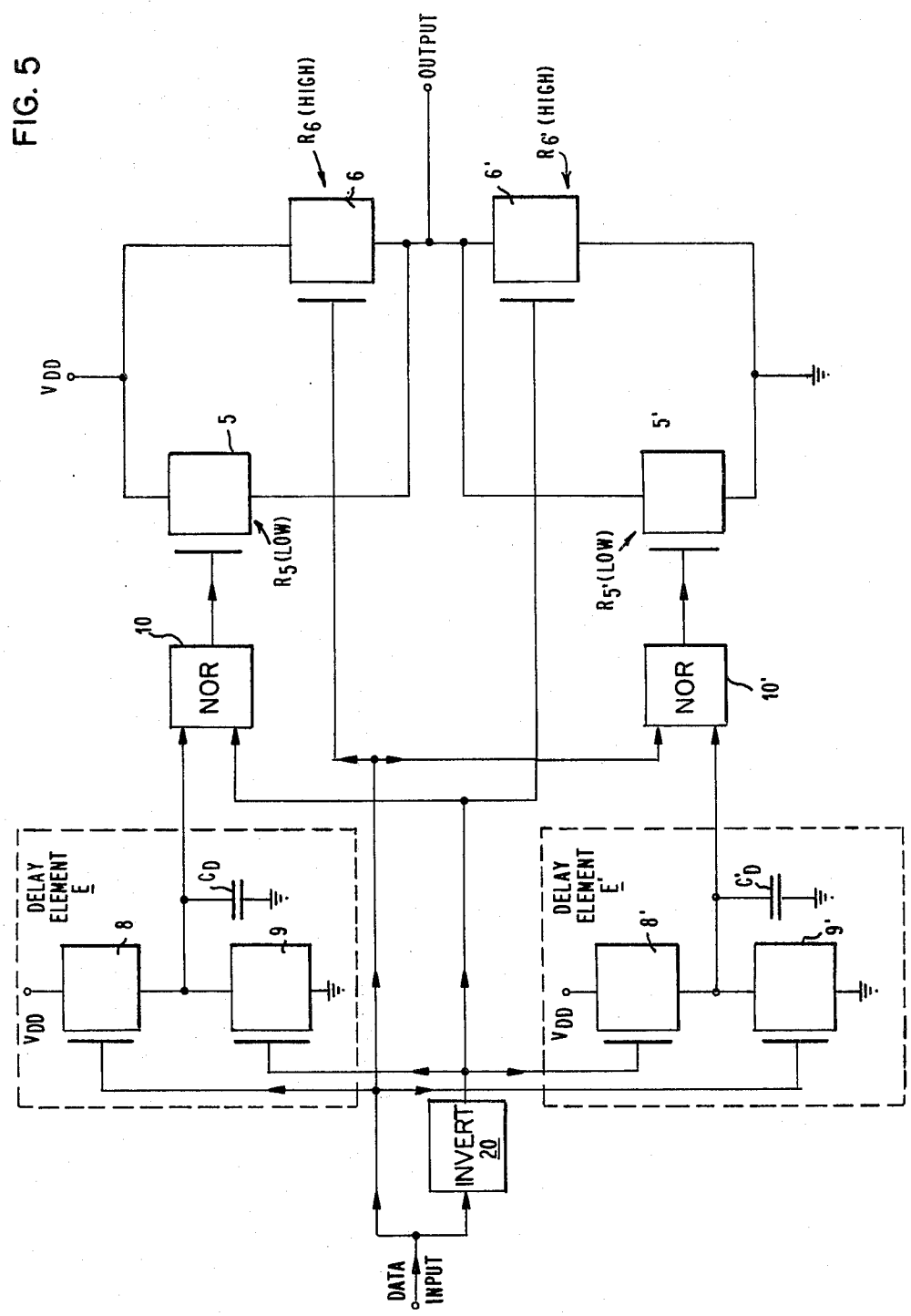
FIG. 5 is an alternate embodiment of the invention illustrating a high speed line driver with protection against shorting to either the positive drain voltage or to ground potential.

A high speed FET line driver circuit is disclosed which provides short circuit protection without reducing performance.

FIG. 1 illustrates a conventional line driver circuit which transfers a data signal from its input at the inverter 1 to the driver output without changing its polarity. The output of the inverter 1 is applied to the gate of the active FET device 4 and also to the input of the inverter 2. The output of the inverter 2 is applied to the gate of the FET load device 3. The FET active device 4 has a relatively low on-resistance R4 and the FET load device 3 has a relatively low on-resistance R3. When the conventional driver circuit of FIG. 1 is in its binary 1 state with the relatively high level binary signal at the data input and at the data output, the circuit can be inadvertently destroyed by the accidental grounding of the output terminal. This would cause excessive current to be conducted from the drain potential VDD through the relatively low resistance R3 of the load device 3 to the output node. The magnitude of the shorting current could be reduced by increasing the resistance R3 of the load device 3, however this will severely impair the rise time characteristics of the output signal during ordinary operation since the signal current passing through the load device 3 must charge the output capacitance $C_{out}$ in transitioning from the low level to the high level.

This problem is solved by the circuit invention shown in FIG. 2. The function of the load device 3 and the conventional driver circuit of FIG. 1 is shared by two load devices; the FET load device 5 which has a relatively low on-resistance $R_5$ and the FET load device 6 which has a relatively high on-resistance $R_6$. In order to provide a large charging current during the positive transition of the output, both the load devices 5 and 6 are turned on. This provides a fast rise time for the output signal. However after a predetermined delay period the low resistance load device 5 is turned off so that the positive binary value of the output signal is maintained by the load device 6. If the output terminal were inadvertently shorted to ground during a testing operation or under other circumstances, device 5 would be protected because its brief on-time limits the duration of the high short circuit current which limits the energy dissipated in device 5 below destructive levels and, the relatively high resistance $R_6$ of the load device 6 would prevent an unacceptably large shorting current from flowing from the drain voltage VDD through the device 6 to the output node.

The circuit of FIG. 2 further includes the delay element E which is comprised of the FET device 8 and the FET device 9 connected as a conventional active load, non-inverting buffer whose output is connected to the delay capacitor $C_D$ and to the first input of the NOR circuit 10. The gate of the active load FET device 8 is connected to the data input terminal. The data input terminal is also connected to the input of the inverter 11 whose output is connected to the gate of the active device 7, is connected to the gate of the active device 9, and is also connected as the second input to the NOR circuit 10. The output of the NOR circuit 10 drives the gate of the low resistance FET load device 5.

When the input data terminal is at the binary zero or the low signal voltage value, the load device 6 is off, the load device 5 is off, and the active device 7 is on, thereby providing the ground potential or binary zero output value at the output node. This is achieved as follows. The inverter 11 is a high speed circuit, such as is shown in FIG. 1 of U.S. Pat. No. 3,775,693. The low value for the data-in signal is inverted in the high speed inverter 11 and is applied as a positive potential to the gate of device 7, keeping it on. The low voltage value of the data-in signal is applied to the gate of the load device 6 keeping it off. The low voltage value of the data-in signal is applied to the gate of the load device 8 in the delay element E, keeping the device 8 off. During the same interval, the relatively high voltage from the inverter 11 is applied to the gate of the active device 9 maintaining it on, and thus applying ground potential to the first input of the NOR circuit 10. Since the output of the inverter 11 is a relatively high voltage which is applied to the second input of the NOR 10, the output of the NOR 10 is the relatively low binary value voltage which, when applied to the gate of the transistor 5, maintains the transistor 5 in its off state.

When the data-in signal transitions from the binary zero to the binary one or high state, the following operation occurs. The positive going input signal is directly applied to the gate of the load device 6 turning it on. The positive going signal at the data input terminal is inverted in the high speed inverter 11 and the resultant negative going signal is applied to the gate of the active FET device 7, turning it off. The fast negative transition of the signal output from the inverter 11 is applied to the second input of the NOR circuit 10. The NOR circuit 10 is a high speed circuit such as is shown in FIG. 1a of U.S. Pat. No. 3,775,693, and therefore rapidly produces a positive transitioning signal which is applied to the gate of the low resistance FET load device 5, turning it on. Current from the drain potential VDD now rapidly flows through the low resistance FET load device 5 into the output node of the driver circuit, charging the output capacitance $C_{out}$, thereby achieving a fast rise time transition for the output signal.

During this interval, the negative going transition signal output from the inverter 11 is also applied to the gate of the active FET device 9 in the delay element E. Since the device 8 is turned on and the device 9 is turned off, the delay capacitance $C_D$ is now being charged through the device 8 from the drain potential VDD. After a predetermined period of time, the potential at the first input of the NOR device 10 which is connected to the source of the FET device 8, becomes positive and a delayed negative transitioning signal is output from the NOR device 10 which is applied to the gate of the FET device 5, thereby turning the low resistance FET load device 5 off. During the steady state with a positive output signal at the output of the circuit, the low resistance FET load device 5 is off and the high resistance FET load device 6 is on. During this steady state positive output condition, if the output terminal of the circuit were inadvertently shorted to ground, the high resistance $R_6$ of the FET load device 6 would prevent a damaging shorting current from flowing through the device 6 from VDD to the output terminal. Further, device 5 is protected because its brief on-time limits the energy dissipated in the device to safe levels.

FIG. 3 is an illustration of the line driver waveforms for the circuit of FIG. 2 under normal conditions. There are nine waveforms which are identified by the voltage or current names shown in FIG. 2. The data waveform makes a positive transition A which immediately gates on the FET 6, allowing a small current to flow as is shown at E for the $I_{R6}$ waveform. The output voltage does not rise because the current is shunted through FET device 7 as is shown at H for the current waveform IR7. After one unit delay, $V_2$ falls as is shown at B, causing FET device 6 to turn off. The current in FET device 6 now flows into the output capacitance $C_{out}$ and the output terminal voltage $V_{out}$ begins to rise slowly as is seen at F. After another unit of delay, the voltage $V_3$ rises, turning on the FET device 5, allowing a high charging current to flow into the output capacitance $C_{out}$, as is shown at J in the current waveform IR5 and as is shown at K in the current waveform $I_{out}$. This causes the output voltage $V_{out}$ to rise rapidly as is seen at G, to the drain voltage VDD as is seen at L. At this time all output currents become zero. Also at this time or shortly thereafter, the delayed voltage $V_1$ rises as is seen at D, causing the voltage $V_3$ to fall after one gate delay interval as is seen at M, disabling the FET device 5. Thus, in normal operation, a full charging current into the output capacitance $C_{out}$, is allowed by the pulsing of the voltage $V_3$. The pulse width of $V_3$ has been designed so as to be long enough to allow full charging of the output capacitance $C_{out}$. The upper limit of the $V_3$ pulse width is that interval which limits the total pulse energy below the amount required to destroy the driver circuit when the output is grounded, as is seen in the waveform diagrams of FIG. 4.

FIG. 4 illustrates a sequence of nine waveform diagrams similar to those of FIG. 3, for the line driver of FIG. 2, when the output is grounded. Data makes a positive transition at A and turns on the device 6, allowing a small current B in the waveform IR6, to flow into the shorted output as is seen at C for the output current $I_{out}$. After one unit of delay, the voltage $V_2$ falls as is seen at D, which in turn causes the voltage $V_3$ to rise as is seen at E, turning on the device 5. Short circuit current flows through the device 5 as is seen at F for IR5, into the shorted output as is seen at J for the output current $I_{out}$. After the delay element comprising devices 8 and 9 and the capacitor $C_D$ provides the delay, $V_1$ rises causing the voltage $V_3$ to fall, thereby turning off the device 5, as is seen at I for the current IR5. The output current falls to a safe level at K for the current $I_{out}$, before destruction of the driver can occur. One feature of this invention is that the peak output power is enabled only for a period long enough to provide rapid line charging of the output capacitance $C_{out}$. Since the energy at peak power that is required to destroy the driver is far greater than that energy required to charge the output capacitance $C_{out}$, the device is effectively protected. In other words, protection is achieved by limiting energy rather than power.

The positive pulse width at the gate input of the FET device 5 is designed to match the worst case rise time at the output of the line driver. This worst case rise time is less than 20 nanoseconds (for a two micron FET technology) measured from the most positive down level (0.4 volts) to the least positive up level (2.4 volts), driving a capacitive load of 100 pf. Thus, if the output is accidentally shorted to ground during this up time (less than 20 nanoseconds), a large transient current can flow from the positive drain potential VDD into the circuit but cannot damage the circuit since the energy in the current pulse is far less than that amount (corresponding to an estimated several hundred microseconds) required for the destruction of a metal conductor in the circuit.

FIG. 5 shows an alternate embodiment of the invention wherein a high speed line driver is protected against shorting to either the positive VDD potential or the ground potential. Basically, the mirror image of the circuit shown in FIG. 2 is duplicated in FIG. 5 and serves to protect the device 7 in FIG. 2. FIG. 5 shows the delay element E, the NOR circuit 10, the FET device 5 and the FET device 6 which operate in the same manner in FIG. 5 as they do in FIG. 2. In addition, a delay element E', NOR circuit 10', FET device 5' and FET device 6' serve corresponding functions to their unprimed reference numeral elements in FIG. 5, for the protection of the portion of the circuit against shorting currents flowing between the output terminal and ground potential. In particular, the low on-resistance FET device 5' and the high on-resistance FET device 6' of FIG. 5 are effectively substituting for the FET device 7 in FIG. 2. If the output terminals were inadvertently shorted to ground, the circuit protective function would be the same in FIG. 5 as that which was described for FIG. 2. Alternately, if the output terminal were inadvertently shorted to the +VDD drain potential, then when the input data signal transitions downwardly, the NOR circuit 10' outputs a positive going potential turning on the relatively low impedance FET device 5', thereby shorting the output terminal to ground potential and a relatively large current begins to flow through the FET device 5'. After the predetermined delay provided by the delay element E', in a manner similar to that described for the delay element E, the output of the delay element E' starts rising and causes the output of the NOR circuit 10' to fall, thereby turning off the low impedance FET device 5' after a short period of time, shorter than would be necessary to destroy the elements in the circuit. This protects the circuit from inadvertent shorting to the +VDD potential.

Thus it is seen that the operation of the circuit shown in FIG. 5 is based on the same principles as have been disclosed for the circuit of FIG. 2, and that the circuit is protected from inadvertent shorting to both the positive drain potential VDD as well as the ground potential.

The resulting high speed FET line driver circuit provides short circuit protection at the output node without reducing the circuit performance.

Although a specific embodiment of the invention has been disclosed, it will be understood by those of skill in the art that the foregoing and other changes in form and details may be made therein without departing from the spirit and the scope of the invention.

Having thus described our invention, what we claim is new, and desire to secure by Letters Patent is:

1. An FET driver circuit with an output shorting protection feature, comprising:
   an active FET device having its source/drain path connected between ground potential and an output node and its gate connected to an input node, for switching off its source/drain path when a first polarity input signal is applied to said input node;
   a first, relatively low resistance FET load device having its source/drain path connected between a drain potential and said output node, for selectively providing a relatively fast charging current path to said output node in response to a signal on its gate;
   a second, relatively high resistance FET load device having its source/drain path connected between said drain potential and said output node and having a gate connected to said input node, for selectively providing a relatively slow charging current path to said output node when said first polarity signal is applied to said input node;
   switching means having an input connected to said input node and an output connected to said gate of said first FET load device, for turning on said fast charging current path when said input signal transitions from ground potential to said first polarity and for turning off said fast charging current path after a predetermined delay;
   whereby said output node is provided with a fast charging current when said input signal begins said first polarity state and then said output node is thereafter protected from ground shorts by having a high resistance as its sole connection to said drain potential.

2. The apparatus of claim 1, which further comprises:
   a high speed inverter circuit connected between said input node and said gate of said active FET device, for switching off said source/drain path thereof when said first polarity input signal is applied.

3. The apparatus of claim 2, wherein said switching means further comprises:
   a high speed two input NOR circuit having first and second inputs and an output connected to said gate of said first FET load device, with the first input thereof connected between the output of said high speed inverter circuit and said gate of said active FET device;
   a delay circuit including a third FET load device having its source/drain path connected between said second input of said NOR circuit and said drain potential and its gate connected to said input node and further including a second active FET device having its source/drain path connected between said second input of said NOR circuit and said ground potential and its gate connected to said output of said high speed inverter;
   a capacitance connected between said second input of said NOR circuit and said ground potential, for forming an RC positive rise-time delay with the resistance of said third FET load device;

whereby when said input signal transitions from said ground potential to said first polarity, NOR circuit outputs an enabling signal to said first FET load device turning on said source/drain path thereof and thereafter as said capacitance is charged through said third FET load device, said second input said NOR circuit transitions toward said drain voltage, and said NOR circuit outputs a disabling signal to said first FET load device.

4. The apparatus of claim 1, wherein said predetermined delay is long enough to permit a desired quantity of said charging current to flow into said output node but short enough to limit said charging current to a quantity less than that which would destroy said circuit.

5. An FET driver circuit with an output shorting protection feature, comprising:
a first, relatively low resistance FET device having its source/drain path connected between a drain potential and an output node, for selectively providing a relatively fast charging current path to said output node in response to a signal on its gate;
a second, relatively high resistance FET device having its source/drain path connected between said drain potential and said output node and having a gate connected to an input node, for selectively providing a relatively slow charging current path to said output node when a first polarity signal is applied to said input node;
a third, relatively low resistance FET device having its source/drain path connected between a ground potential and said output node, for selectively providing a relatively fast sinking current path from said output node in response to a signal on its gate;
a fourth, relatively high resistance FET device having its source/drain path connected between said ground potential and said output node and having a gate connected to said input node, for selectively providing a relatively slow sinking current path from said output node when a ground polarity signal opposite to said first polarity signal is applied to said input node;
a first switching means having an input connected to said input node and an output connected to said gate of said first FET device, for turning on said fast charging current path when said input signal transitions from ground potential to said first polarity and for turning off said fast charging current path after a predetermined delay;
a second switching means having an input connected to said input node and an output connected to said gate of said third FET device for turning on said fast sinking current path when said input signal transitions from said first polarity to said ground potential and for turning off said fast sinking current path after a predetermined delay;
whereby said output node is alternately provided with a fast charging current or a fast sinking current when said input signal changes state and then said output node is thereafter protected from ground shorts or first polarity shorts by having a high resistance as its sole connection to said drain potential or ground potential, respectively.

6. The apparatus of claim 5, which further comprises:
a high speed inverter circuit connected between said input node and said gate of said fourth FET device, for switching off said source/drain path thereof when said first polarity input signal is applied.

7. The apparatus of claim 6, wherein said first switching means further comprises:

a first high speed two input NOR circuit having first and second inputs and an output connected to said gate of said first FET device, with the first input thereof connected between the output of said high speed inverter circuit and said gate of said fourth FET device;
a first delay circuit including a fifth FET device having its source/drain path connected between said second input of said first NOR circuit and said drain potential and its gate connected to said input node and further including a sixth FET device having its source/drain path connected between said second input of said first NOR circuit and said ground potential and its gate connected to said output of said high speed inverter;
a first capacitance connected between said second input of said first NOR circuit and said ground potential, for forming an RC positive rise-time delay with the resistance of said fifth FET load device;
whereby when said input signal transitions from said ground potential to said first polarity, said first NOR circuit outputs an enabling signal to said first FET device turning on said source/drain path thereof and thereafter as said first capacitance is charged through said fifth FET device, said second input of said first NOR circuit transitions toward said drain voltage, and said first NOR circuit outputs a disabling signal to said first FET device.

8. The apparatus of claim 7, wherein said predetermined delay is long enough to permit a desired quantity of said charging current to flow into said output node but short enough to limit said charging current to a quantity less than that which would destroy said circuit.

9. The apparatus of claim 8, wherein said second switching means further comprises:
a second high speed two input NOR circuit having first and second inputs and an output connected to said gate of said third FET device, with the first input thereof connected to said input node;
a second delay circuit including a seventh FET device having its source/drain path connected between said second input of said second NOR circuit and said drain potential and its gate connected to the output of said high speed inverter and further including a eighth FET device having its source/drain path connected between said second input of said second NOR circuit and said ground potential and its gate connected to said input node;
a second capacitance connected between said second input of said second NOR circuit and said ground potential, for forming an RC positive rise-time delay with the resistance of said seventh FET device;
whereby when said input signal transitions from said first polarity to said ground potential said second NOR circuit outputs an enabling signal to said third FET device turning on said source/drain path thereof and thereafter as said second capacitance is charged through said seventh FET device, said second input of said second NOR circuit transitions toward said drain voltage, and said second NOR circuit outputs a disabling signal to said third FET device.

10. The apparatus of claim 9, wherein said predetermined delay of said second delay circuit is long enough to permit a desired quantity of said sinking current to flow from said output node but short enough to limit said sinking current to a quantity less than that which would destroy said circuit.

* * * * *